(12) United States Patent
Eibl

(10) Patent No.: US 11,635,451 B2
(45) Date of Patent: Apr. 25, 2023

(54) MEASUREMENT DEVICE WITH LOCAL BROWSER APPLICATION

(71) Applicant: Rohde & Schwarz GmbH & Co. KG, Munich (DE)

(72) Inventor: Joachim Eibl, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 376 days.

(21) Appl. No.: 16/894,470

(22) Filed: Jun. 5, 2020

(65) Prior Publication Data

US 2021/0025921 A1   Jan. 28, 2021

Related U.S. Application Data

(60) Provisional application No. 62/879,205, filed on Jul. 26, 2019.

(51) Int. Cl.
| | | |
|---|---|---|
| *G01R 13/02* | (2006.01) | |
| *G01R 19/25* | (2006.01) | |
| *H04L 67/02* | (2022.01) | |
| *G01R 27/26* | (2006.01) | |
| *G06F 9/54* | (2006.01) | |
| *G01R 23/16* | (2006.01) | |

(52) U.S. Cl.
CPC .......... *G01R 13/029* (2013.01); *G01R 19/25* (2013.01); *G01R 23/16* (2013.01); *G01R 27/26* (2013.01); *G06F 9/547* (2013.01); *H04L 67/02* (2013.01)

(58) Field of Classification Search
CPC ...... G01R 13/029; G01R 19/25; G01R 23/16; G01R 27/26; G01R 15/125; G06F 9/547; H04L 67/02
See application file for complete search history.

(56) References Cited

U.S. PATENT DOCUMENTS

| | | | |
|---|---|---|---|
| 5,790,977 A | 8/1998 | Ezekiel | |
| 6,560,557 B1* | 5/2003 | Carnahan | G06F 11/2294 |
| | | | 702/123 |
| 11,158,422 B1* | 10/2021 | Wilson | G16H 40/63 |
| 2002/0075267 A1* | 6/2002 | Cake | G01R 13/345 |
| | | | 345/440 |
| 2002/0097243 A1* | 7/2002 | Miller | G05B 15/02 |
| | | | 345/440.1 |
| 2002/0105520 A1* | 8/2002 | Farkas | G06F 9/44505 |
| | | | 345/440 |
| 2003/0125898 A1 | 7/2003 | Stark | |
| 2007/0234195 A1* | 10/2007 | Wells | G06F 16/9577 |
| | | | 715/205 |
| 2015/0022181 A1* | 1/2015 | Anderson | G06F 9/5005 |
| | | | 324/114 |

* cited by examiner

*Primary Examiner* — Raul J Rios Russo
(74) *Attorney, Agent, or Firm* — Ditthavong, Steiner & Mlotkowski

(57) ABSTRACT

The invention relates to an electrical, preferably portable and battery-powered, measurement device. The device comprises:
an electrical measurement unit supplying electrical measurement signals,
a processing unit processing said electrical measurement signals,
a memory, and
a display controlled by the processing unit and displaying the processed electrical signals,
wherein the processor is arranged to execute an operating system stored in the memory, and
wherein the in the memory furthermore a local web browser application is stored which can be
executed by the processor in order to control the display.

11 Claims, 3 Drawing Sheets

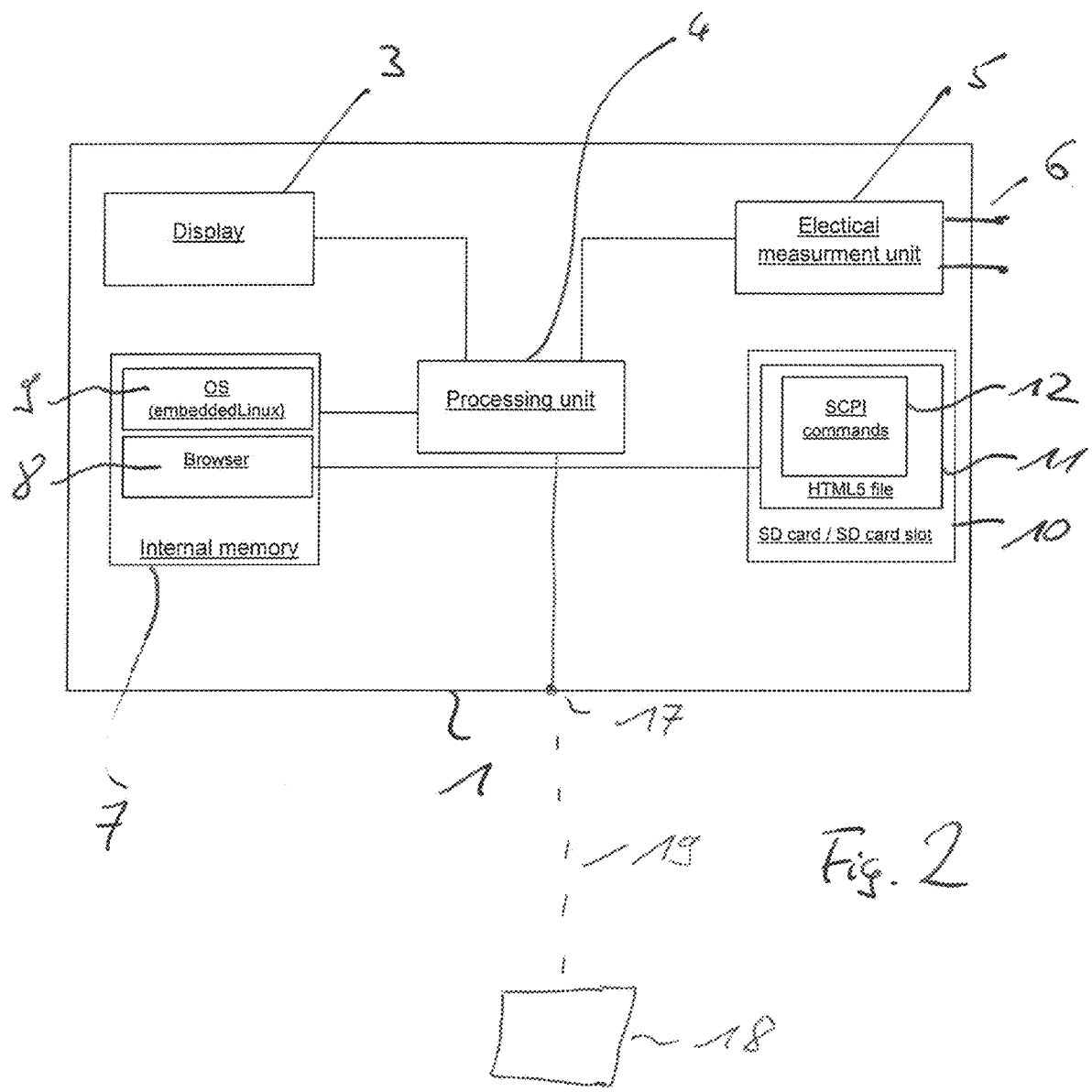

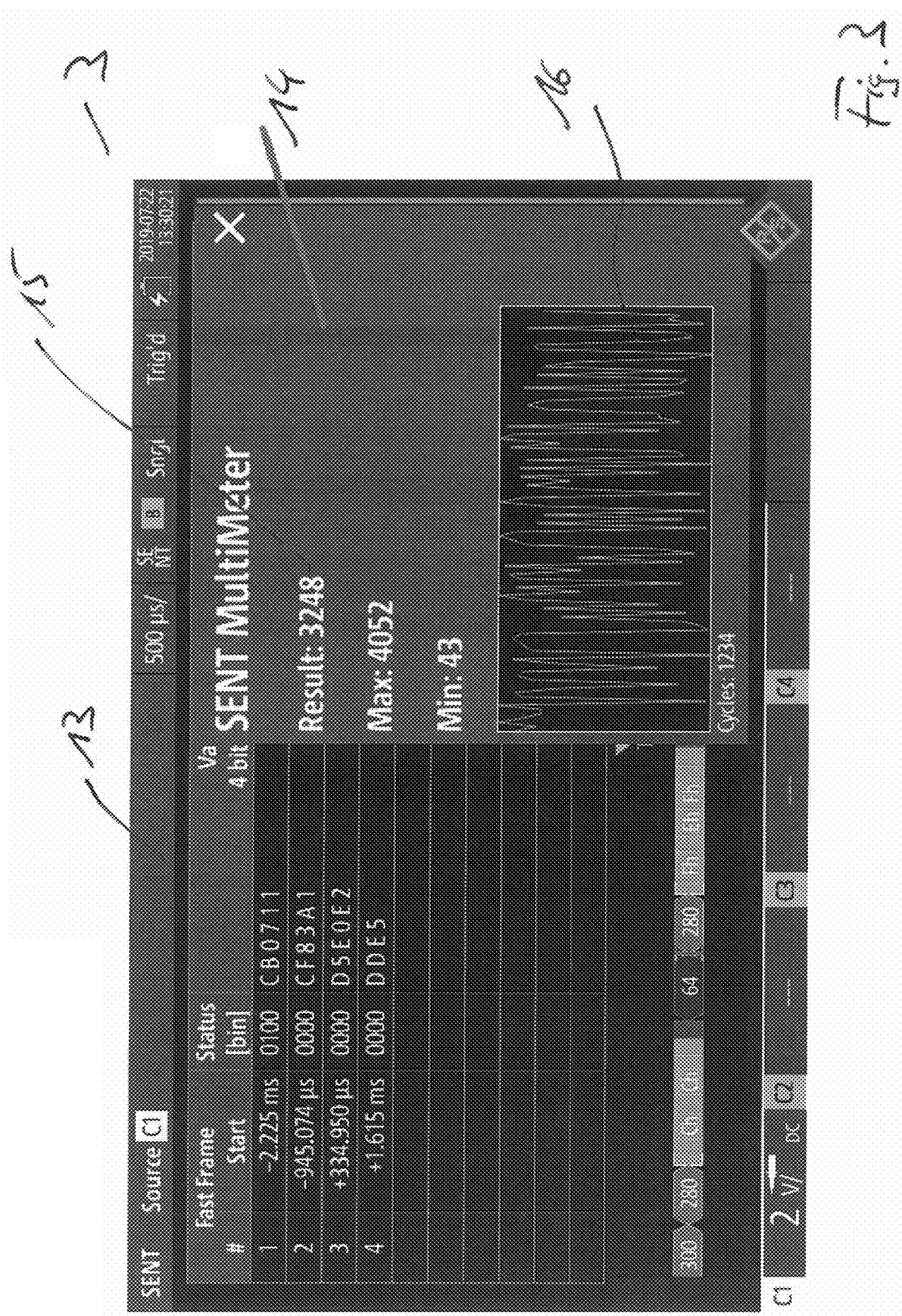

MEASUREMENT DEVICE WITH LOCAL BROWSER APPLICATION

Figure 1:
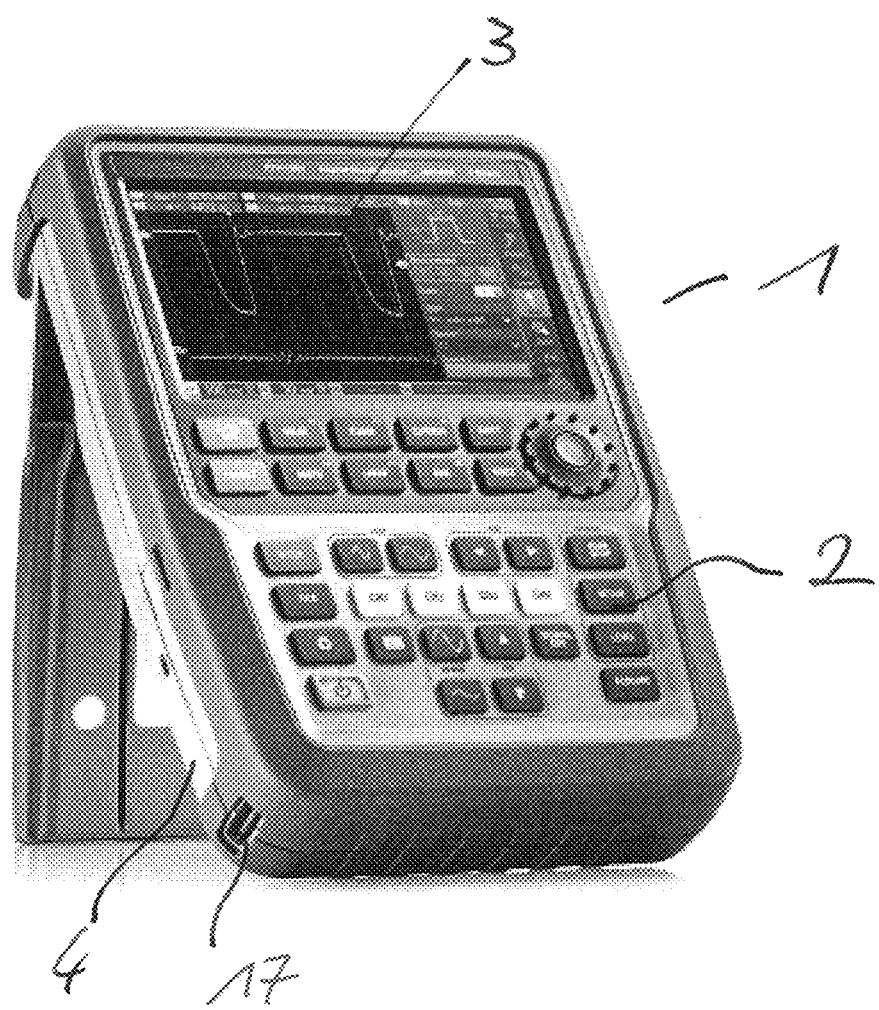

The background of the invention is the field of electrical measurement devices for measuring, processing and displaying electrical parameters. The background is especially the area of portable and thus typically battery-powered measurement devices.

FIG. 1 shows an example of a portable handheld electrical measurement device, which according to this example is a handheld oscilloscope 1. As can be seen in FIG. 1, the oscilloscope has a display 3 as well as a user interface 2, which allows for a manual input by a user, typically such compact handheld electrical measurements device 1 is powered by one or more batteries 4. Furthermore, typically such electrical measurement device 1 is provided with one or more interfaces 5 for a wireless or wire-bound communication.

Especially, such communication interface 17 can be used to connect the shown compact electrical measurement device 1 e.g. with a portable computing device in order to process, analyze and/or display electrical measurement signals on the portable computing device in a user defined manner going beyond the defined processing, analysis and display capabilities which may be hard to be find in the electrical measurement device 1 itself.

US 2003/0125898A1 discloses a customizable and extendable data processing architecture for a data acquisition instrument.

U.S. Pat. No. 5,790,977 discloses a data acquisition from a remote instrument via the internet.

Therefore, there is a need for an electrical measurement device allowing for user defined processing, analysis and/or display of electrical measurement signals without the need of having to connect a further device to the compact electrical measurement device.

This object is achieved by means of the features of the independent claim 1.

A first aspect relates to an electrical, preferably portable and battery-powered, measurement device.

The device comprises:
an electrical measurement unit supplying electrical measurement signals,
a processing unit processing said electrical measurement signals,
a memory, and
a display controlled by the processing unit and displaying the processed electrical signals,
wherein the processor is arranged to execute an operating system stored in the memory, and wherein the in the memory furthermore a local web browser application is stored which can be executed by the processor in order to control the display.

The processor and the local web browser application may be arranged for executing a HTML based application.

The HTML based application may be adapted to control the electrical measurement unit and/or process said electrical measurement signals in a user-defined manner.

The HTML base application may be adapted to control the electrical measurement unit by a SCPI command. The SCPI command may be handled by a HTTP get or post instruction.

The HTML based application may display the measurement result in a dedicated window on the display. The window may be resizable, docked and/or floating on the display.

The HTML based application may comprise a HTML development environment for programming said HTML based application.

Said HTML based application may be stored in an internal memory or on an external memory device functionally connected to the measurement device.

The measurement device may be designed to act as an internet client able to access a website for downloading said HTML based application.

The measurement device may implement one or more of a digital oscilloscope, a spectrum analyzer, a voltmeter, an impedance analyzer, a network analyzer or a signal generator functionality.

A further aspect relates to a system comprising the measurement device as described above as well as a functionally connected resource on which said HTML based application can be user-defined for later transfer to the measurement device.

A further aspect relates to a system comprising the measurement device as described above as well as a functionally connected resource from which said HTML based application can be downloaded onto the measurement device.

Yet a further aspect relates to a method for configuring a preferably portable and battery-powered, electrical measurement device, comprising the step of
configuring, on the measurement device or a remote resource a HTML based application to be executed by a local browser application stored in the measurement device.

Further aspects of the invention will be explained by reference to the figures of the enclosed drawings:
FIG. 1 shows a portable measurement device,
FIG. 2 shows a block diagram of an example of a measurement device, and
FIG. 3 shows a display of a measurement device of FIG. 1.

FIG. 2 shows in a schematic manner a block diagram of a compact, i.e. typically handheld/or battery-powered electrical measurement device 1 having a functionality allowing a user to define processing, analysis and display function to be executed on the compact device 1 itself.

The electrical measurement device 1 may implements one or more of a digital oscilloscope, a spectrum analyzer, a voltmeter, an impedance analyzer, a network analyzer or a signal generator functionality. In the framework of the present description the example of a digital oscilloscope will be used.

As shown in FIG. 2, the compact electrical measurement device 1 has an electrical measurement unit 5, which typically is provided with one or more terminals 6 for supplying electrical measurement signals.

The electrical measurement unit 5 is in functional connection with a processing unit 4. The processing unit 4 controls a display 3. Furthermore, the processing unit 4 is functionally connected to an internal memory 7, on which typically the operating system 9, which may be e.g. an embedded Linux system, is provided.

Furthermore, in the internal memory 7, a local browser application 8 is stored.

An external memory, such as for example an SD card 10 may be provided, on which a HTML based application file ii may be stored, executing SCPI commands 12. However, the HTML based application file ii may also be stored in an internal memory of the measurement device 1.

As shown in FIG. 2, thus, in addition to the operating system 9, an integrated local web browser application 8 is provided allowing to run a HTML based application ("App") which gives the user the functionality of defining one or more analysis, processing and/or display functions of the device 1 going beyond the ones which are encoded in the operating system 9.

The HTML based application typically comprises a GUI to be displayed on the display 3. At least a part of the display may be a touch screen. The SCPI commands 12 allow for a communication with the internal memory 7 and the processing unit 4. SCPI queries may be communicated via a HTTP-get request or a HTTP-post request. Thus the HTML based application has access to data representing the measurement signals, on order to process, analyze, display and/or store them in a manner which a user may define within the framework of the HTML based application. Processed or analyzed data may also be returned from the HTML based application to the operating system.

FIG. 3 shows the display 3 of the device 1 in a state where in addition to a display region 13 controlled on the basis of the operating system 9, a further HTML-based window 14 is displayed which is controlled by the GUI of the HTML file 11. The HTML-based window 14 may be resizable, docked and/or floating on the display 3.

The HTML based window 14 may display parameters 15 set by the user and/or being the result of a processing of the measurement signals. Alternatively or additionally the HTML based window 14 may display processed or unprocessed measurement signals in a graphical representation 16.

The HTML-based application 11 may comprise a HTML development environment for programming a HTML-based application to be stored in a memory 10 of the device 1. The HTML development may be run on a remote resource, such as a computer, a tablet etc.

Note that after the set-up of the HTML based application no further device is required in addition to the measurement device itself.

The device 1, together with its browser 8, may act as an internet client able to access a website on a remote resource 18 for downloading a HTML-based application using for example the interface 5. Using a wireless or wire bound interface 17 the measurement device 1 may be in functional connection with such remote resource.

The interface 17 may be at least one of a LAN connection, a wireless LAN or a USB connection.

The HTML-based display region 14 of the display 3 may show user-defined settings and parameters for processing 15 of the analysis and processing of the electrical signals. Furthermore, also a user-defined graphical representation 16 of electrical measurement data can be part of this HTML-based display region 14.

The invention claimed is:

1. An electrical measurement device, preferably portable and battery-powered comprising:

an electrical measurement unit supplying electrical measurement signals, a processor processing said electrical measurement signals, a memory, and a display controlled by the processor and adapted to display the processed electrical measurement signals, wherein:

the processor is arranged to execute an operating system stored in the memory, and in the memory furthermore a local web browser application is stored which can be executed by the processor, the processor and the local web browser application are arranged for executing a HTML, based application, and the HTML based application is adapted to control the electrical measurement unit and/or process said electrical measurement signals in a user-defined manner.

2. The measurement device according to claim 1, wherein the HTML based application is adapted to control the electrical measurement unit by a SCPI command.

3. The measurement device according to claim 2, wherein the SCPI command is handled by HTTP get or post request.

4. The measurement device according to claim 1, wherein the HTML, based application displays the measurement result in a dedicated window on the display.

5. The measurement device according to claim 4, wherein the window is resizable, docked and/or floating on the display.

6. The measurement device according to claim 1, wherein the HTML based application comprises a HTML development environment for programming said HTML based application.

7. The measurement device according to claim 1, wherein said HTML based application is stored in an internal memory or on an external memory device functionally connected to the measurement device.

8. The measurement device according to claim 1, which is designed to act as an internet client able to access a website for downloading said HTML based application.

9. The measurement device of claim 1, which implements one or more of a digital oscilloscope, a spectrum analyzer, a voltmeter, an impedance analyzer, a network analyzer or a signal generator functionality.

10. A system comprising the measurement device of claim 1 as well as a functionally connected resource on which said HTML, based application can be user-defined for later transfer to the measurement device.

11. A system comprising the measurement device of claim 1 as well as a functionally connected resource from which said HTML based application can be downloaded onto the measurement device.

* * * * *